US011879915B2

(12) United States Patent
Hörist

(10) Patent No.: US 11,879,915 B2
(45) Date of Patent: Jan. 23, 2024

(54) METHOD AND SYSTEM FOR EVALUATING AN INPUT VOLTAGE OF A POWER SUPPLY

(71) Applicant: Siemens Aktiengesellschaft, Munich (DE)

(72) Inventor: Gerald Hörist, Vienna (AT)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 21 days.

(21) Appl. No.: 17/686,608

(22) Filed: Mar. 4, 2022

(65) Prior Publication Data

US 2022/0326285 A1 Oct. 13, 2022

(30) Foreign Application Priority Data

Mar. 5, 2021 (EP) .................................... 21160897

(51) Int. Cl.
*H02S 50/10* (2014.01)
*G01R 19/257* (2006.01)
*G01R 19/25* (2006.01)

(52) U.S. Cl.
CPC ....... *G01R 19/257* (2013.01); *G01R 19/2513* (2013.01)

(58) Field of Classification Search
CPC .............. G01R 19/257; G01R 19/2513; G01R 19/175; G01R 23/02; G01R 31/40; G01R 19/00
USPC ....................................... 324/120, 76.11, 500
See application file for complete search history.

(56) References Cited

U.S. PATENT DOCUMENTS

| 4,494,067 | A | 1/1985 | Barszczewski |
| 7,266,465 | B1 | 9/2007 | Tsui et al. |
| 10,110,246 | B1 | 10/2018 | Zrilic |
| 11,063,794 | B2 * | 7/2021 | Shibata .................. G11C 27/02 |
| 11,428,717 | B2 * | 8/2022 | De Fazio ............. G01R 19/257 |
| 2015/0233979 | A1 * | 8/2015 | Barrenscheen .. G01R 19/16547 324/120 |
| 2016/0126825 | A1 | 5/2016 | Huang et al. |

(Continued)

FOREIGN PATENT DOCUMENTS

| DE | 3852556 | 5/1995 |
| EP | 1789810 | 5/2007 |
| KR | 20150108133 | 9/2015 |

OTHER PUBLICATIONS

EP Search Report dated Sep. 14, 2021 based on EP21160897 filed Mar. 5, 2021.

*Primary Examiner* — Giovanni Astacio-Oquendo
(74) *Attorney, Agent, or Firm* — Cozen O'Connor

(57) ABSTRACT

Method and system for evaluating an input voltage of a power supply or a switched-mode power supply, wherein the input voltage has a constant polarity, where a digitized input voltage is supplied as the input signal to a filter which is filtered such that an output signal from the filter lags the input signal of the filter at the input of the filter, where the input signal and the output signal of the filter are compared, where comparison results are evaluated during an evaluation period until, following a first change in state of a comparison result, a further change in state of the comparison result is identified, and where a respective evaluation period is then terminated and subsequently, a period duration and/or a frequency of an AC voltage component of the input voltage are determined using the present count value of a counter.

20 Claims, 3 Drawing Sheets

(56) References Cited

U.S. PATENT DOCUMENTS

| | | |
|---|---|---|
| 2017/0336448 A1 | 11/2017 | Jang et al. |
| 2019/0293695 A1* | 9/2019 | Guthrie .............. G01R 19/0038 |
| 2022/0408837 A1* | 12/2022 | Zhu ..................... H03K 17/687 |

* cited by examiner

METHOD AND SYSTEM FOR EVALUATING AN INPUT VOLTAGE OF A POWER SUPPLY

BACKGROUND OF THE INVENTION

1. Field of the Invention

The invention generally relates to the field of electrical engineering, in particular the sector of power electronics and power electronic circuitry and, more particularly, to a system and method for evaluating an input voltage of a power supply or of a switched-mode power supply, where the input voltage has a constant polarity.

2. Description of the Related Art

In manufacturing and automation technology, power supplies and switched-mode power supplies are widely used to supply consumers such as electronic controllers, pumps, valves and/or sensors. These consumers are supplied with a suitable, frequently predefined voltage by the power supply or switched-mode power supply. Frequently, for this purpose, a voltage level that is high on an input side of the switched-mode power supply is converted to a lower, usually constant voltage level, predefined for the consumers, on an output side of the switched-mode power supply.

Power is usually supplied to the switched-mode power supply at a line voltage from a single-phase or three-phase supply network, as the supply voltage. With a single-phase or three-phase line voltage (e.g., 230-volt AC voltage, three-phase AC voltage) as the supply voltage, the switched-mode power supply frequently has an input stage, for example in the form of a rectifier unit, which converts the AC voltage from the supply network into a time-variable, usually pulsed DC voltage as the input voltage for the switched-mode power supply. That is, downstream of the input stage, or downstream of the rectifier unit, there is usually an input voltage that has a constant polarity (i.e., the polarity of the input voltage remains the same over time, or does not change) of which, however, the amplitude is time-variable or is subject to fluctuations over time. The power supply or the switched-mode power supply then converts the input voltage into a constant output voltage for the electrical consumers, where constancy of the output voltage and/or an output current is achieved by adjusting the flow of energy.

In switched-mode power supplies today, it is becoming more and more important to detect the network conditions, such as network frequency, and/or network voltage, and indeed disturbances in the supply network (such as a phase failure in a three-phase supply voltage, and/or an overvoltage pulse or surge). Switched-mode power supplies, for example, can only operate to the optimum within a certain input voltage range. Accordingly, it is important to know the network conditions in order to be able to take measures if there is a deviation from an optimum input voltage range. In particular, an undervoltage on the input side, or an undervoltage from the supply network, can result in an increase in the input current, for example, because of the constancy of the output voltage of the switched-mode power supply. This can result, for example, in the components of the switched-mode power supply becoming heated, or even damaged. Hence, for safety reasons the supply voltage or input voltage is usually monitored, and if appropriate the output from the switched-mode power supply is switched off if, for example, the monitored voltage falls below a predetermined value. In order to avoid overheating or damage to the switched-mode power supply as a result of an undervoltage on the input side, or an undervoltage from the supply network, it is necessary to monitor the input voltage continuously and as exactly as possible in order if appropriate to take measures (such as switching off the output from the switched-mode power supply). In this case, in particular a frequency of the change over time in the amplitude of the input voltage of the switched-mode power supply or an AC voltage component of the input voltage of the switched-mode power supply and/or fluctuations in the amplitude of the input voltage can be determined.

A common variant for measuring frequency and voltage is provided, for example, by Fourier analysis. Fourier analysis is used primarily for decomposing time-variable or periodic signals into a collection of sine functions of different frequencies and amplitudes. If a non-sinusoidal oscillation is the starting point in a Fourier analysis, then the Fourier analysis makes it possible to determine, for example, the harmonics involved. That is, with a rectified AC voltage as the input voltage, Fourier analysis can be used, for example, to identify the AC voltage component, in particular the frequency of the AC voltage component. Furthermore, by using a Fourier analysis it is also possible, for example, to detect disturbances in the line voltage. In order to evaluate the input voltage of a switched-mode power supply using Fourier analysis, however, it is necessary for an appropriate measuring instrument or logic circuit, for example, to be provided to perform the Fourier analysis. This results, for example, in additional costs for hardware and/or a need for additional memory for a corresponding computer algorithm.

A further possibility for measuring the frequency and voltage of an input voltage of a switched-mode power supply entails, for example, measuring the time between two predetermined or fixed points of the input voltage. In this way, it is then possible to derive from the time period between the two predetermined points of the input voltage, for example, a frequency of the change over time in the amplitude of the input voltage of the switched-mode power supply. For this, however, it is necessary, for example, using an additional measuring device, to measure the time period between the predetermined points, and accordingly to be able to define the corresponding points of the input voltage in advance. That is, an approximate time characteristic of the input voltage should be known in order to predetermine the fixed measuring points, because otherwise the derivation of the frequency could conceivably be very inexact or erroneous.

Furthermore, there are known from the Applicant's hitherto unpublished European patent application No. 19205873.3, for example, a circuit arrangement and a method via which an input voltage of a power supply can be evaluated. Here, an analog circuit arrangement is used to derive two output signals from the supply voltage of the power supply or switched-mode power supply, and from these output signals a measurement of the supply voltage (for example, an average value) and a type of voltage of the supply voltage (for example, DC voltage or AC voltage) can be derived. However, this circuit arrangement and above all the associated method have the disadvantage that they are primarily applicable to evaluation of a supply voltage of single-phase power supplies. Furthermore, evaluation of the supply or input voltage of the switched-mode power supply requires an additional circuit arrangement and therefore entails additional expense. Furthermore, only the type of voltage of the supply voltage of the switched-mode power supply can be derived using the circuit arrangement and the associated method. That is, the method only detects whether the supply voltage is a DC voltage or a single-phase AC voltage; the frequency of the supply voltage can only be estimated in broad terms. Exact evaluation of an input voltage of a switched-mode power supply, in particular a rectified three-phase supply voltage, is not possible using the circuit arrangement or the associated method.

SUMMARY OF THE INVENTION

In view of the foregoing, it is therefore an object of the invention to provide a method and system for evaluating an input voltage of a switched-mode power supply that make it possible, simply and inexpensively and without major work, to evaluate exactly an input voltage of constant polarity and time-variable amplitude.

This and other objects and advantages are achieved in accordance with the invention by a system and method for evaluating an input voltage of a power supply or of a switched-mode power supply. Here, the input voltage to be evaluated has a constant polarity. That is, although the input voltage of the switched-mode power supply changes in amplitude over time, the polarity remains the same over time, or does not change, as in, for example, the case of a DC voltage that fluctuates over time or a rectified single-phase or three-phase AC voltage or a "pulsed" DC voltage. The input voltage is sampled or digitized by being sampled at a predetermined sampling rate. Here, the duration of a period of the sampling rate or sampling cycle is substantially shorter than that of a period of an expected frequency of the AC voltage component or the ripple of the input voltage, or that the sampling cycle has a substantially higher frequency than an expected frequency of the AC voltage components or the ripple of the input voltage to be evaluated. The digitized input voltage is then supplied to a filter unit as an input signal and filtered by the filter unit such that an output signal from the filter unit lags the input signal of the filter unit. This means that the output signal from the filter unit is based on a sample value of the digitized input voltage that precedes in time a sample value of the digitized input voltage upon which the input signal of the filter unit is based. That is, the filter unit, for example, because of the form it takes, causes at least a time delay between the input signal and the output signal. The input and output signals of the filter unit are then compared using a comparator unit. The comparison results, which are delivered as an output signal from the comparator unit, are subsequently evaluated. Here, the comparison results that have been delivered by the comparator unit are evaluated during an evaluation period that is started by resetting a counter unit until, following a first change in state of a comparison result, a further change in state of a comparison result is identified. That is, evaluation of the comparison results continues until, following a first change in a value or state at the output of the comparator unit, another change in the value or state is identified at the output of the comparator unit. The respective evaluation period is then terminated, and subsequently, using a present count value of the counter unit, a period duration and/or a frequency of an AC voltage component of the input voltage are determined.

The main aspect of the present invention is that, for implementation, there is little expense for components and/or memory requirement. For example, it is a very simple matter to use pre-existing hardware, such as an open and/or closed-loop control unit of the switched-mode power supply, to implement the method in accordance with the invention. Furthermore, using the method it is a very simple matter to determine a frequency of the AC voltage component of the input voltage of the switched-mode power supply in order to be able to draw well-founded conclusions on events, such as disturbances and/or phase failure, in a supply voltage of the switched-mode power supply and to be able to take appropriate measures. Furthermore, the method (in particular the input signal or the digitized voltage at the input of the filter unit and the output signal from the filter unit, which are compared for the purpose of determining the frequency) can be adapted almost automatically to changes over time in the input voltages, because the filter unit takes a form such that the output signal from the filter unit lags in relation to the input signal of the filter unit. That is, as a result of the filtering, the output signal from the filter unit undergoes at least a time delay in relation to the digitized input voltage forming the input signal of the filter unit. Furthermore, the method can be used over large input voltage ranges, because, for evaluation, there is no need to predetermine thresholds, for example, but rather the method can be adapted automatically and dynamically to different input voltage range of a switched-mode power supply.

Furthermore, it is favorable if, for the purpose of determining an average value of the input voltage, a sum value of the digitized input voltage added up over the respective evaluation period and the present count value at an end of the respective evaluation period are used. Based on the sum value determined over the respective evaluation period, it is a very simple matter to calculate an average value of the input voltage by dividing the sum value by the present count value, which is retrieved from the counter unit at the end of the respective evaluation period. To arrive at the sum value, the sample values of the digitized input voltage are added up over the sampling period at the sampling rate.

It is also advantageous if, during a respective evaluation period, a minimum value and a maximum value of the digitized input voltage are detected. Using the minimum and maximum value that are detected during a respective evaluation period, it is a very simple matter to establish whether a presumed useful signal is noise, for example. For a meaningful evaluation of the input voltage, it is important, for example, that a difference between the minimum and the maximum value of a respective evaluation period should exceed a predeterminable minimal value so that an evaluation free of disturbances can be performed.

Ideally, before sampling the input voltage is reduced to a voltage range suitable for signal processing. In the case of switched-mode power supplies, which are supplied, for example, by a single-phase or three-phase network voltage, the rectified input voltage may lie in the region of approximately 550 volts. In order to achieve an input voltage range that can be processed, for example, by an analog-to-digital converter and/or microcontroller, it is useful to reduce the input voltage to a voltage in the region of approximately 3 volts for signal processing.

In one advantageous embodiment of the invention, the comparator unit uses a hysteresis when comparing the input signal of the filter unit with the output signal from the filter unit. The use of a hysteresis when comparing the input and output signal of the filter unit enhances immunity to disturbances in a very simple manner. The hysteresis allows for example erroneous measurements resulting from any signal noise to be prevented very easily.

Furthermore, it is advantageous if, when a predetermined maximum count value of the counter unit is reached, evaluation of the comparison result from the comparator unit is terminated. If, during an evaluation period, upon evaluation of the comparison results from the comparator unit, for example, no first and/or no further change in state is identified, then by reaching or exceeding the predetermined count value of the counter unit evaluation of the comparison results can be terminated very simply, for example, via a "timeout". In that case, the counter unit can be reset, for example, for another evaluation period. The fact that the counter unit reaches or exceeds the predetermined count value may, for example, also make it possible to identify, for example, that a barely changing DC voltage is the input voltage of the switched-mode power supply. As the predetermined count value there is selected, for example, a count value that corresponds to a period of significantly longer duration than that of a period of the lowest expected frequency of the AC component of the input voltage for evaluation.

Furthermore, it is advantageous if, after digitization or sampling of the input voltage, a noise suppression and/or noise reduction is performed. This reduces or prevents, for example, undesired noise in the digitized signal of the input voltage, or in the digitized input voltage, and hence achieves a better and more exact evaluation result.

It is also an object of the invention is also achieved by a system for evaluating an input voltage of a switched-mode power supply, where the input voltage has a predetermined polarity. Here, the system for implementing the method in accordance with the contemplated embodiments of the invention includes at least the following: functional components an analog-to-digital converter for digitizing the input voltage, wherein the input voltage is sampled at a predetermined sampling rate; at least one filter unit for filtering the digitized input voltage, where the filter unit is formed such that an output signal from the filter unit lags the input signal of the filter unit; a comparator unit for comparing the input signal of the filter unit with the output signal from the filter unit; a counter unit for measuring a respective evaluation period, wherein the counter unit can be reset at the start of the respective evaluation period; a sequence control system that takes the form of a state machine and is configured to: start a respective evaluation period by resetting at least the counter unit; evaluate comparison results delivered by the comparator unit as an output signal until, following a first change in state of the comparison results, a further change in state of the comparison results is identified; after the further change in the starting state of the comparator unit, terminate a respective evaluation period, and retrieve at least a present count value of the counter unit in order to determine the duration of a period and/or a frequency of an AC voltage component of the input voltage; and includes a timer unit that uses a clock signal to set a time control and the sampling rate of the analog-to-digital converter.

The advantage of the proposed system lies in the fact that the system can be implemented for a switched-mode power supply very simply and without major work (e.g., additional components, or memory requirements). It is thus possible, using the system, to evaluate the input voltage of a switched-mode power supply, in particular a frequency of the AC voltage component, in a simple manner. In this way, disturbances in the supply voltage of the switched-mode power supply, such as a phase failure in a three-phase supply voltage, can be detected quickly and simply. In this way, it is possible for example to take measures quickly and, for example, to inform a user of a disturbance.

It is furthermore advantageous if an integrator unit is provided for adding up the digitized input voltage over the respective evaluation period, where the integrator unit can be reset at the start of the respective evaluation period. With the aid of the integrator unit, it is possible to add up the sample values of the digitized input voltage over the evaluation period very simply, for example, in the sampling cycle. A sum value of the integrator unit can then be retrieved by the sequence control system at the end of the evaluation period and, for example, an average value of the input voltage of the switched-mode power supply can be determined from this, using the count value at the end of the evaluation period. Knowledge of the average value of the input voltage makes it advantageously possible to detect, for example, whether the switched-mode power supply is operating in an optimum voltage range, or whether there are deviations and appropriate measures need to be taken.

Ideally, a detector unit is also provided, for detecting peak values of the digitized input voltage during the respective evaluation period, where the detector unit can be reset at the start of the respective evaluation period. As a result of the detector unit, it is a simple matter to determine a minimum value and a maximum value of the input voltage during the respective evaluation period and, for example, for the sequence control system to retrieve and evaluate them at the end of the evaluation period.

Favorably, a voltage divider is arranged on an input side of the analog-to-digital converter, which can reduce the input voltage to a voltage range suitable for signal processing. As a result of appropriate dimensioning, it is possible, for example, to put the rectified input voltage of a switched-mode power supply, which is supplied via a single-phase or three-phase network voltage, at a voltage level that can be used for signal processing by, for example, electronic hardware (e.g., programmable logic circuit, or microcontroller).

In a specific embodiment of the system in accordance with the invention, a further filter unit is arranged between an output of the analog-to-digital converter and an input of the filter unit. Ideally, this further filter unit serves to filter the digitized input voltage in order, for example, to reduce undesired noise and thus to make evaluation of the input voltage more exact. This further filter unit may be formed, for example, as a first-order low-pass filter, and may have, for example, a filter time constant that is greater than or equal to the sampling rate of the analog-to-digital converter.

Ideally, the system is implemented with the aid of a microcontroller or a programmable logic circuit. Here, it is possible, for example, to a microcontroller for the system that is already present, such as for an open or closed-loop control unit of the switched-mode power supply. Here, the analog-to-digital converter may, for example, be integrated in the microcontroller. As an alternative, however, it is also possible for the analog-to-digital converter be formed as a separate component that provides the sampled input voltage in the form of a string of sample values.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be explained below by way of example, with reference to the attached figures, in which.

DETAILED DESCRIPTION OF THE EXEMPLARY EMBODIMENTS

Figure 1:
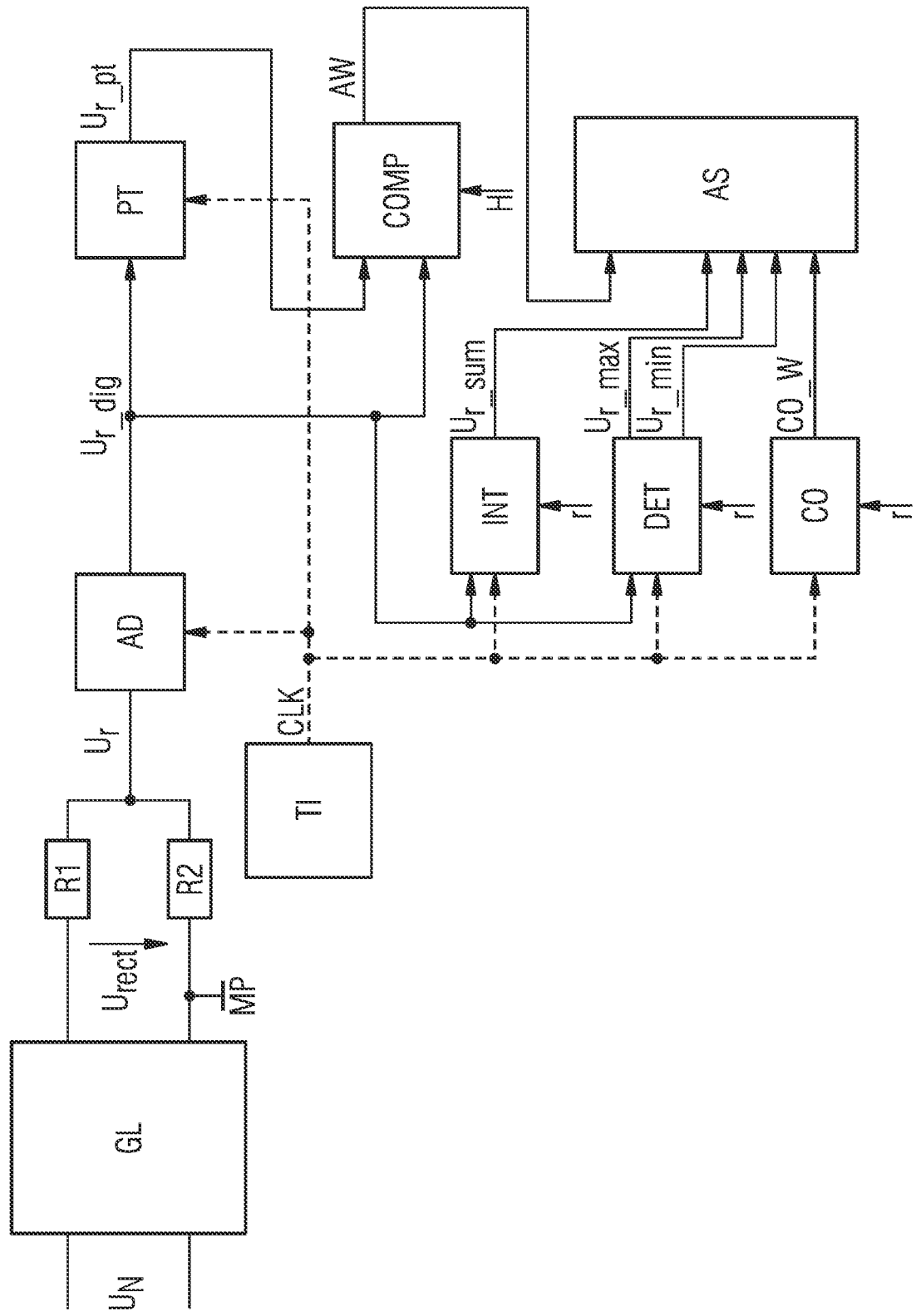
FIG. 1 shows, schematically and by way of example, an embodiment of the system for evaluating an input voltage of a switched-mode power supply in accordance with the invention.

FIG. 1 shows an exemplary schematic block diagram of the system for evaluating an input voltage $U_{rect}$ of a switched-mode power supply, where the system has functional units that can be implemented as hardware and/or software units, where functional units of the system that are formed as software units may be implemented, for example, in a microcontroller. As an alternative, the system may be implemented at least with the aid of a programmable logic circuit.

Here, the switched-mode power supply is supplied, for example, by a supply voltage UN. The supply voltage UN may be, for example, a single-phase or three-phase line voltage from a power supply network. The supply voltage UN is fed to an input stage GL of the switched-mode power supply, where, for example, depending on the supply voltage UN, the input stage GL may be formed as a 2-pulse or 6-pulse rectifier unit GL. The rectifier unit GL rectifies the supply voltage UN and generates an input voltage $U_{rect}$ for the switched-mode power supply. The input voltage $U_{rect}$, which is expressed in relation to a reference potential MP (e.g., 0 volts), has a defined or constant polarity. That is, the polarity does not change over the time characteristic of the input voltage $U_{rect}$. The amplitude of the input voltage $U_{rect}$ does undergo a change over time, however, such as due to a "ripple" that is produced, for example, by rectification of the supply voltage UN by the rectifier unit GL.

The input voltage $U_{rect}$ of the switched-mode power supply is then fed to a voltage divider that comprises, for example, the resistors R1 and R2. This voltage divider puts the input voltage $U_{rect}$ which, for example, with a supply or line voltage UN of, for example, 400 volts is in the region of approximately 550 volts, into a voltage region (e.g., approximately 3 to 4 volts) that is useful for implementing the method in accordance with the invention or of which the signals can be processed. As a result of the voltage divider, or as a result of a relationship between the resistors R1 and R2, the input voltage $U_{rect}$ is reduced to an input voltage $U_r$ at a level that makes signal processing possible (e.g. 3.3 volts).

The reduced input voltage $U_r$ is fed to an analog-to-digital converter AD that digitizes or samples the reduced input voltage $U_r$. The analog-to-digital converter AD may be formed, for example, as a separate component or can be integrated in the microcontroller via which the method in accordance with the invention is performed. Furthermore, for correct operation of the analog-to-digital converter AD, for example, it may be necessary to connect a capacitor, for which for the sake of simplicity is not shown in FIG. 1, to an input of the analog-to-digital converter AD. Here, the capacitor should be selected such that, as far as possible, a signal shape of the input voltage $U_r$ is not affected. The analog-to-digital converter AD samples the analog input voltage $U_r$ at a sampling rate or sampling frequency. The analog-to-digital converter AD then delivers a sampled or digitized input voltage $U_{r\_dig}$, for example, in the form of a chronological string of sample values.

The sampling rate, or a clock for sampling the reduced input voltage $U_r$, is delivered by an output signal or a clock signal CLK from a clock generator or timer unit TI. Thus, through its output signal or the clock signal CLK, the timer unit TI assumes time control of the analog-to-digital converter AD but also of the further functional units of the system in accordance with the invention. This means that the respective output signals of these functional units are always available at the clock rate CLK of the timer unit TI at the respective output of the functional unit. A frequency of the clock signal CLK is freely selectable (e.g., 10 kHz). However, because the clock signal CLK also forms the sampling rate of the analog-to-digital converter AD, it must be ensured that the sampling rate or sampling frequency and hence the clock signal CLK are substantially greater than an expected frequency of the AC voltage components or the ripple of the expected input voltage $U_{rect}$ or the reduced input voltage $U_r$. Thus, the duration of a period of the sampling frequency is also significantly shorter (e.g. 100 µs) than that of the input voltage $U_{rect}$ of the switched-mode power supply or the reduced input voltage $U_r$ of overlaid ripples.

The digitized input voltage $U_{r\_dig}$ is now fed to a filter unit PT. The filter unit PT is formed, for example, as a first-order digital low-pass filter unit that has an amplification P (e.g., P=1) and a time constant T. Here, the filter time constant T is, for example, greater than or at least equal to the duration of the period of the sampling rate CLK or that of the clock signal CLK. For example, the filter time constant T may be 4 times or ideally 16 times the duration of the period of the sampling rate or clock signal CLK. In this way, the filter unit PT has a filtering effect and a runtime for a filtered output signal $U_{r\_pt}$ as a result of which, for example, the output signal $U_{r\_pt}$ from the filter unit PT lags, or at least has a time delay in relation to, the input signal $U_{r\_dig}$ of the filter unit PT. That is, the output signal $U_{r\_pt}$ from the filter unit PT is based on a sample value of the digitized input voltage $U_{r\_dig}$ that, in time terms, precedes a sample value of the digitized input voltage $U_{r\_dig}$ that is applied as the input signal $U_{r\_dig}$ of the filter unit PT at the input of the filter unit PT with the same clock signal CLK of the timer unit TI or with the same clock edge of the clock signal CLK.

The input signal $U_{r\_dig}$ of the filter unit PT and the output signal $U_{r\_pt}$ from the filter unit PT are then supplied to a comparator unit COMP. Depending on whether the input signal $U_{r\_dig}$ of the filter unit PT is greater or smaller than the output signal $U_{r\_pt}$ from the filter unit PT, a comparison result AW at the output of the comparator unit COMP may have a different value or state. Here, the comparison result AW may, for example, have a first value or state if the input signal $U_{r\_dig}$ of the filter unit PT is smaller than the output signal $U_{r\_pt}$ from the filter unit PT. If the input signal $U_{r\_dig}$ of the filter unit PT is greater than the output signal $U_{r\_pt}$ from the filter unit PT, then the comparison result AW at the output of the comparator unit COMP has a second value or state, for example.

The comparison comprising which of the two signals $U_{r\_dig}$, $U_{r\_pt}$ of the filter unit PT is the greater and which the smaller can be performed by the comparator unit COMP, for example, with or without hysteresis H. When a hysteresis H is used in the evaluation, for example, any signal noise can reduce or prevent erroneous measurements. In this arrangement, depending on which comparison result AW applies or which value or state the comparison result AW has at the output of the comparator unit COMP, the hysteresis H may, for example, be added to the input signal $U_{r\_dig}$ and the output signal $U_{r\_pt}$ of the filter unit PT or subtracted from them. This brings about positive feedback, which makes the comparison result AW of the comparator unit COMP more stable.

The comparison result AW of the comparator unit COMP is forwarded to a sequence control system AS as the respectively present value or state at the output of the comparator unit COMP. The sequence control system controls a sequence of the evaluation of the input voltage $U_{rect}$ or the reduced input voltage $U_r$, and can thus determine a duration of a respective evaluation period and, from this, a frequency of an AC voltage component or ripple overlaid on the input voltage $U_{rect}$ or $U_r$. For this purpose, the sequence control system is formed, for example, as a "state machine", which can move from a present, first state into a new, second state if there is a first change in the comparison result AW at the output of the comparator unit COMP, or if the value or state at the output of the comparator unit COMP changes for the first time. In the event of a further change in the comparison result AW at the output of the comparator unit COMP, the sequence control system AS can switch from the second state, through a third state or calculation state and a reset step, back to the first state. An exemplary detailed sequence of evaluation of the comparison results AW of the comparator unit COMP by the sequence control system AS is illustrated in FIG. 2b and, with reference to this, is described in more detail by way of example.

Furthermore, the sequence control system AS receives signals from a counter unit CO, an integrator unit INT and a detector unit DET, and these can be reset by a reset signal r, such as to start a respective evaluation period. Here, the counter unit CO counts the pulses of the clock signal CLK of the timer unit TI. At the start of the respective evaluation period, the counter unit CO can be started by the sequence control system AS, via the reset signal r. At the end of the respective evaluation period, the counter unit CO delivers a count value CO_W or count CO_W to the sequence control system AS, and a duration of the respective evaluation period can be derived from this count CO_W. The counter unit CO can be then reset again for a new evaluation period, via the reset signal r of the sequence control system AS.

The integrator unit INT adds up the signals or sample values of the digitized input voltage $U_{r\_dig}$ over the respective evaluation period. At the end of the respective evaluation period, the integrator unit INT can provide the sequence control system AS with a sum value $U_r$ sum of the digital input voltage $U_{r\_dig}$, and the sequence control system AS can derive, for example, an average value of the input voltage $U_{rect}$ from this sum value $U_{r\_sum}$. The integrator unit INT can likewise be reset by the reset signal r at the start of each new evaluation period. The integrator unit INT is also clocked by the clock signal CLK of the timer unit TI.

During the respective evaluation period, a maximum value $U_{r\_max}$ of the digitized input voltage $U_{r\_dig}$ and a minimum value $U_{r\_min}$ of the digitized input voltage $U_{r\_dig}$ are detected by the detector unit DET. At the end of the respective evaluation period, these values $U_{r\_max}$, $U_{r\_min}$ are provided to the sequence control system AS. The detector unit DET can likewise be reset by the reset signal r at the start of each new evaluation period. Moreover, the detector unit DET is also clocked by the clock signal CLK of the timer unit TI.

Figure 2A:
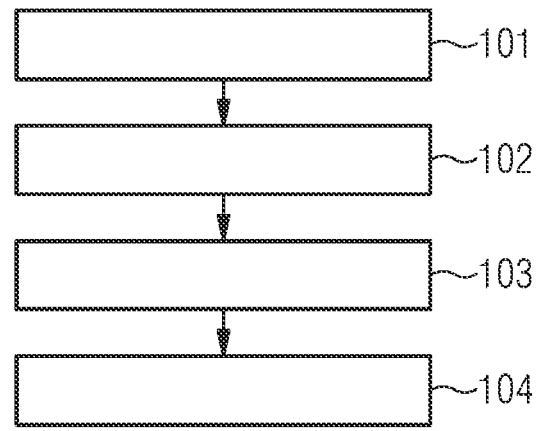
FIG. 2a shows, schematically, an exemplary flowchart of the method for evaluating an input voltage of a switched-mode power supply in accordance with the invention.
Figure 2B:
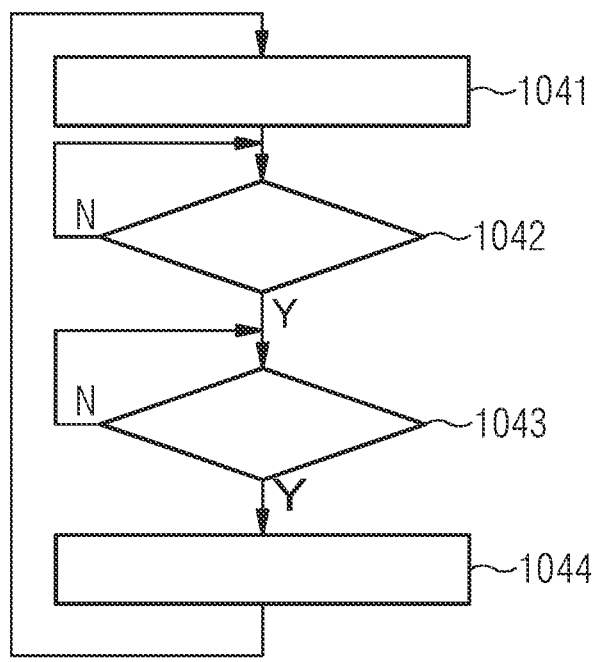
FIG. 2b shows, schematically, an exemplary flow chart of an evaluation of comparison results from the comparator unit in accordance with the invention.

FIG. 2a shows, schematically and by way of example, a flowchart of the method for evaluating the input voltage $U_{rect}$ of a switched-mode power supply. Here, the input voltage $U_{rect}$ has a constant and defined polarity, but an amplitude that changes over time. Before a first step 101 of the method, a voltage divider R1, R2 can put the input voltage $U_{rect}$ into a voltage range that is suitable for signal processing by, for example, a microcontroller. The input voltage $U_{rect}$ of the switched-mode power supply is reduced, for example, to an input voltage $U_r$.

In the first step 101, or in a digitization step 101, the reduced input voltage $U_r$ is converted into the digitized input voltage $U_{r\_dig}$ by the analog-to-digital converter AD. For this purpose, the input voltage $U_r$ is sampled at a sampling rate or sampling frequency that is set, for example, by the clock signal CLK of the timer unit TI. The sampled or digitized input voltage $U_{r\_dig}$ is then provided at the output of the analog-to-digital converter AD, for example, in the form of a chronological string of sample values.

The digitized input voltage $U_{r\_dig}$ is then fed to the filter unit PT for filtering in a filtering step 102. The filter unit PT in this case is formed such that the output signal $U_{r\_pt}$ from the filter unit PT is at least time-delayed in relation to the input signal that is formed by the digitized input voltage $U_{r\_dig}$. That is, the output signal $U_{r\_pt}$ from the filter unit PT lags the input signal $U_{r\_dig}$ of the filter unit PT and is based on a sample value of the digitized input voltage $U_{r\_dig}$ that, in terms of time, precedes a sample value of the digitized input voltage $U_{r\_dig}$ that is applied as the input signal at the input of the filter unit PT with the same clock signal CLK of the timer unit TI.

In a comparison step 103, the input signal $U_{r\_dig}$ and the output signal $U_{r\_pt}$ from the filter unit PT are fed to the comparator unit COMP and compared with one another. The comparison result AW at the output of the comparator unit COMP may, for example, have different values or states depending on whether the input signal $U_{r\_dig}$ or the output signal $U_{r\_pt}$ from the filter unit PT is the greater. The comparison result AW that is determined in the comparison step 103 is then forwarded to the sequence control system AS.

Next, in an evaluation step 104, the sequence control system AS evaluates the comparison result AW delivered by the comparator unit COMP. For the purpose of evaluating the comparison results AW delivered continuously by the comparator unit COMP, the sequence control system AS is formed, for example, as a state machine.

A flow chart of the evaluation, by the sequence control system AS, of comparison results delivered by the comparator unit COMP is illustrated schematically and by way of example in FIG. 2b.

For the purpose of starting an evaluation period, in a reset step 1041, the sequence control system AS uses the reset signal r to reset the counter unit CO to a starting value (e.g. the value 0). The counter unit CO counts the pulses of the clock signal CLK of the timer unit TI during the respective evaluation period. In addition, the integrator unit INT and the detector unit DET can be reset to respective starting values (e.g. the value 0), and hence adding up of the digitized input voltage $U_{r\_dig}$ over the respective evaluation period and detection of the minimum and maximum value $U_{r\_min}$, $U_{r\_max}$ of the digitized input voltage $U_{r\_dig}$ during the respective evaluation period can be started. Then, the sequence control system AS performs a switch back to the first state, for example, after the reset step 1041.

In a first check step 1042, the sequence control system checks the comparison results AW that are continuously delivered by the comparator unit COMP for a first state change. That is, the sequence control system AS evaluates whether the value or state at the output of the comparator unit COMP changes. As long as an unchanged comparison result AW is delivered by the comparator unit COMP (e.g. the input signal $U_{r\_dig}$ of the filter unit PT remains smaller than the output signal $U_{r\_pt}$, or the input signal $U_{r\_dig}$ of the filter unit PT remains greater than the output signal $U_{r\_pt}$) and so a present value or state is maintained at the output of the comparator unit COMP, the sequence control system AS also remains in the first state and the first check step 1042 continues to be listed.

However, if, in the first check step 1042, a first change in the value or state at the output of the comparator unit COMP is identified, then the sequence control system AS switches from the first state to the second state, and a switch from the first check step 1042 to a second check step 1043 occurs. That is, if the comparison result AW at the output of the comparator unit COMP changes because, for example, the input signal $U_{r\_dig}$ of the filter unit PT becomes greater than the output signal $U_{r\_pt}$ or because the input signal $U_{r\_dig}$ of the filter unit PT becomes smaller than the output signal $U_{r\_pt}$, then the present state of the sequence control system AS is also changed from the first to the second state.

In the second check step 1043, the comparison results AW that are continuously delivered by the comparator unit COMP are then checked again for a further change. As long as the sequence control system AS does not identify a change in state of the value or state at the output of the comparator unit COMP from the delivered comparison results AW, the sequence control system AS remains in the second state and the second check step 1043 continues to be performed. That is, as long as, for example, the input signal $U_{r\_dig}$ of the filter unit PT remains greater than the output signal $U_{r\_pt}$ from the filter unit PT, or the input signal $U_{r\_dig}$ of the filter unit PT remains smaller than the output signal $U_{r\_pt}$, the sequence control system AS maintains the second state and waits until there is a further change in the comparison result AW.

If a further or a second change in the comparison result AW of the comparator unit COMP is identified in the second check step 1043, such as because the input signal $U_{r\_dig}$ of the filter unit PT has become smaller than the output signal $U_{r\_pt}$ from the filter unit PT again, or because the input signal $U_{r\_dig}$ of the filter unit PT has become greater than the output signal $U_{r\_pt}$ again, then the sequence control system switches to the third state, or the calculation state, in which a calculation step 1044 is then performed.

In the calculation step 1044, the respective evaluation period is then terminated, and the sequence control system AS retrieves a present count value CO_W from the counter unit CO. Furthermore, the present sum value $U_{r\_sum}$ from the integrator unit INT, and a minimum value $U_{r\_min}$ and a maximum value $U_{r\_max}$ of the digitized input voltage $U_{r\_dig}$ that have been identified by the detector unit DET during the respective evaluation period can also be transmitted to the sequence control system AS.

Furthermore, in the calculation step 1044, it is possible to derive from the count value CO_W that is retrieved for the respective evaluation period, from the frequency of the clock signal CLK, and from the sum value $U_{r\_sum}$ of the digitized input voltage $U_{r\_dig}$ that is transmitted for the respective evaluation period, a frequency of the AC voltage component and an average value of the input voltage $U_{rect}$. For the purpose of determining the frequency of the AC voltage component of the input voltage $U_{rect}$, for example, the frequency of the clock signal CLK is divided by the count value CO_W that has been determined for the respective evaluation period. For the purpose of determining the average value of the input voltage $U_{rect}$, it is possible, for example, to divide the sum value $U_{r\_sum}$ of the digitized input voltage $U_{r\_dig}$ that has been determined over the respective evaluation period by the count value CO_W determined for the respective evaluation period.

After the calculation step 1044, the reset step 1041 is performed again. In so doing, the counter unit CO, the integrator unit INT and the detector unit DET can be reset to the respective starting values again for a subsequent evaluation period by the sequence control system AS, via the reset signal r. With the reset step 1041, the next evaluation period is started and the sequence control system has the first state again, in order once more to evaluate for example further comparison results AW of the comparator unit COMP via the first and second check steps 1042, 1043.

If no change in the comparison result AW of the comparator unit COMP is identified, for example, during the first check step 1042 and/or the second check step 1043, then the method can be terminated if the value of the counter unit CO reaches or exceeds a predetermined count value. That is, the ongoing evaluation period is terminated or aborted upon reaching or exceeding the predetermined count value. Here, for example, the sequence control system AS can be put in the first state again, and the counter unit CO, the integrator unit INT and the detector unit DET can be reset to the respective predetermined starting values.

Figure 3:
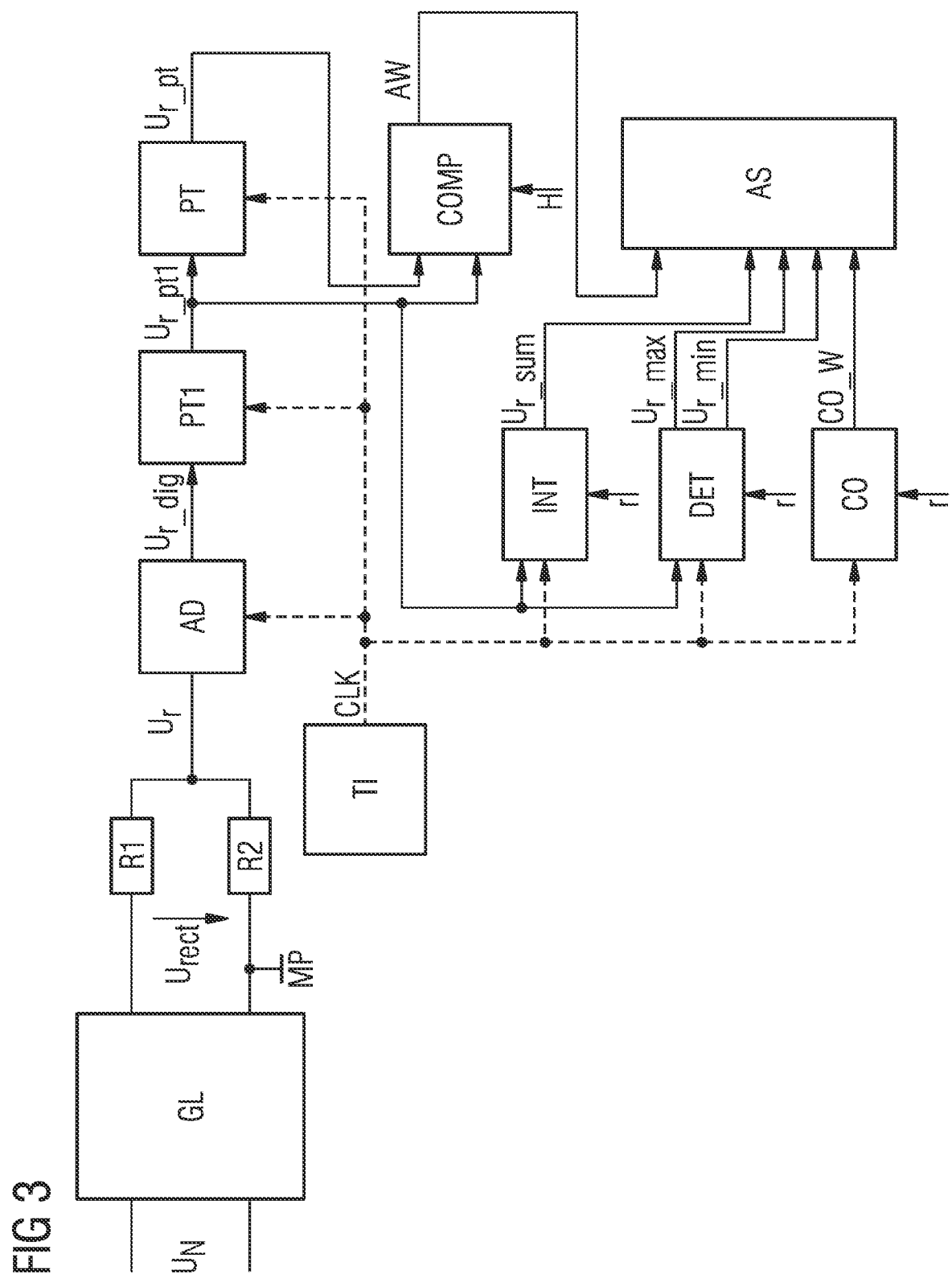
FIG. 3 shows, schematically and by way of example, a further embodiment of the system for evaluating an input voltage of a switched-mode power supply in accordance with the invention.

FIG. 3 shows a further embodiment of the system in accordance with the invention for evaluating an input voltage $U_{rect}$ of a switched-mode power supply via which the method in accordance with the invention can be implement. Here, once again the input voltage $U_{rect}$ of the switched-mode power supply is reduced by the voltage divider R1, R2 to an input voltage $U_r$ of a size suitable for signal processing (e.g., 3.3 volts). The reduced input voltage $U_r$ is once again fed to the analog-to-digital converter AD, by which the reduced input voltage $U_r$ is digitized using the sampling signal or clock signal CLK of the timer unit TI. Next, in contrast to the embodiment illustrated in FIG. 1, the digitized input voltage $U_{r\_dig}$ is first fed to a further filter unit PT1 of which the input side is connected to the analog-to-digital converter AD. At its output side, there is connected to the further filter unit PT1 the filter unit PT, with the output signal $U_{r\_pt1}$ from the further filter unit PT1 now forming the input signal of the filter unit PT. The further filter unit PT1 primarily serves to suppress or reduce noise in the digitized input voltage $U_{r\_dig}$. The further filter unit PT1 may, for example, likewise be formed as a first-order low-pass filter and can have an amplification P (e.g., P=1). Furthermore, the further filter unit PT1 has a filter time constant T that is, for example, greater than or equal to the duration of the period of the sampling rate CLK or of the clock signal CLK.

For the purpose of making a comparison, the comparator unit COMP is then supplied with the output signal $U_{r\_pt1}$ from the further filter unit PT1, which now forms the input signal of the filter unit PT, and the output signal $U_{r\_pt}$ from the filter unit PT. Once again, the two signals $U_{r\_pt1}$, $U_{r\_pt}$ can then be compared with one another with or without hysteresis H.

Once again, the comparator unit COMP then delivers comparison results AW to the sequence control system AS, which then once again controls the evaluation of the comparison results, as described with reference to FIG. 2b. The embodiment illustrated in FIG. 3 also has the counter unit CO, the integrator unit INT and the detector unit DET, which can likewise be clocked using the clock signal CLK from the timer unit TI and reset by the sequence control system AS, via the reset signal r. However, in the embodiment illustrated in FIG. 3, the input signal there is supplied to the integrator unit INT and the detector unit DET digitized input voltage $U_{r\_pt1}$ that has been filtered by the further filter unit PT1, in order to obtain better output values $U_{r\_sum}$, $U_{r\_min}$, $U_{r\_max}$ at the end of the respective evaluation period.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for evaluating an input voltage of a switched-mode power supply, the input voltage having a predetermined polarity, the method comprising:
    sampling the input voltage at a predetermined sampling rate to create a digitized input voltage;
    filtering the digitized input voltage supplied as an input signal to a filter, such that an output signal from the filter lags the input signal of the filter;
    comparing, by a comparator, the input signal of the filter with the output signal from the filter; and
    evaluating, by a sequence control system, comparison results delivered by the comparator;
    wherein, during a respective evaluation period which is started by resetting a counter, comparison results delivered by the comparator are evaluated by the sequence control system until, subsequent to a first change in state of a comparison result, a further change in state of a comparison result is identified; and
    wherein a respective evaluation period is then terminated and, utilizing a present count value of the counter, at least one of a period duration and a frequency of an AC voltage component of the input voltage are determined.

2. The method as claimed in claim 1, wherein a sum value of the digitized input voltage added up over the respective evaluation period and the present count value at an end of the respective evaluation period are utilized to determine an average value of the input voltage.

3. The method as claimed in claim 2, wherein a minimum value and a maximum value of the digitized input voltage are detected during a respective evaluation period.

4. The method as claimed in claim 1, wherein a minimum value and a maximum value of the digitized input voltage are detected during a respective evaluation period.

5. The method as claimed in claim 1, wherein before sampling the input voltage is reduced to a voltage range suitable for signal processing.

6. The method as claimed in claim 1, wherein the comparator utilizes a hysteresis when comparing the input signal of the filter with the output signal from the filter.

7. The method as claimed in claim 1, wherein evaluation of the comparison result from the comparator is terminated when a predetermined maximum count value of the counter is reached.

8. The method as claimed in claim 1, wherein at least one of a noise reduction and noise suppression is performed after digitization of the input voltage.

9. A system for evaluating an input voltage of a switched-mode power supply, the input voltage having a predetermined polarity, the system comprising:
    an analog-to-digital converter for digitizing the input voltage, the input voltage being sampled at a predetermined sampling rate;
    at least one filter for filtering the digitized input voltage as the input signal, the at least one filter being formed such that an output signal from the at least one filter lags the digitized input signal of the at least one filter;
    a comparator for comparing the input signal of the at least one filter with the output signal from the at least one filter;
    a counter for measuring a respective evaluation period, the counter being reset at a start of the respective evaluation period;
    a sequence control system which is configured to:
        start a respective evaluation period by resetting at least the counter;
        evaluate comparison results delivered by the comparator until, subsequent to a first change in state of a comparison result, a further change in state of a comparison result being identified;
        terminate a respective evaluation period after the further change in the starting state of the comparator; and
        retrieve at least a present count value of the counter to determine the duration of at least one of a period and a frequency of an AC voltage component of the input voltage; and
    a timer which utilizes a clock signal to set a time control and the sampling rate of the analog-to-digital converter.

10. The system as claimed in claim 9, further comprising:
    an integrator for adding up the digitized input voltage over the respective evaluation period;
    wherein the integrator is resettable at the start of the respective evaluation period.

11. The system as claimed in claim 10, further comprising:
    a detector for detecting peak values of the digitized input voltage during the respective evaluation period;
    wherein the detector is resettable at the start of the respective evaluation period.

12. The system as claimed in claim 10, further comprising:
    a voltage divider arranged on an input side of the analog-to-digital converter, said voltage divider reducing the input voltage to a voltage range suitable for signal processing.

13. The system as claimed in claim 10, further comprising:
    a further filter arranged between an output of the analog-to-digital converter and an input of the filter.

14. The system as claimed in claim 9, further comprising:
    a detector for detecting peak values of the digitized input voltage during the respective evaluation period;
    wherein the detector is resettable at the start of the respective evaluation period.

15. The system as claimed in claim 14, further comprising:
- a voltage divider arranged on an input side of the analog-to-digital converter, said voltage divider reducing the input voltage to a voltage range suitable for signal processing.

16. The system as claimed in claim 14, further comprising:
- a further filter arranged between an output of the analog-to-digital converter and an input of the filter.

17. The system as claimed in claim 9, further comprising:
- a voltage divider arranged on an input side of the analog-to-digital converter, said voltage divider reducing the input voltage to a voltage range suitable for signal processing.

18. The system as claimed in claim 17, further comprising:
- a further filter arranged between an output of the analog-to-digital converter and an input of the filter.

19. The system as claimed in claim 9, further comprising:
- a further filter arranged between an output of the analog-to-digital converter and an input of the filter.

20. The system as claimed in claim 9, wherein the system is implemented aided by a microcontroller or a programmable logic circuit.

* * * * *